SUBDIVIDED SEMICONDUCTOR WAFER SEPARATOR

Filed Aug. 15, 1969

INVENTOR:
FRANCIS C. GANTLEY,
BY Robert J. Mooney
HIS ATTORNEY.

United States Patent Office
3,606,035
Patented Sept. 20, 1971

3,606,035

SUBDIVIDED SEMICONDUCTOR WAFER SEPARATOR

Francis Charles Gantley, Fulton, N.Y., assignor to General Electric Company

Filed Aug. 15, 1969, Ser. No. 850,551
Int. Cl. B26f 3/00
U.S. Cl. 214—1R 2 Claims

ABSTRACT OF THE DISCLOSURE

This invention related to a method and an apparatus for supplying a predetermined spacing to individual semiconductor pellets, subdivided from a parent semiconductor wafer without changing the relative orientation and position the pellets occupied in the parent wafer prior to the subdivision. The separator comprises a sheet of stretchable material having a major face adapted to support an array of pellets, means for holding the sheet in a taut condition, and means engageable with the sheet for simultaneously stretching the same in two mutually perpendicular coordinates in the plane of the major face. Thus, when the stretching of the sheet is increased, the spacing between the pellets supported on the sheet also increases and thereby facilitates treatment of each individual pellet with minimized disturbance of its neighbor.

This invention relates to semiconductor devices. More particularly, the invention relates to a semiconductor pellet separator which separates a previously subdivided wafer into easily accessible semiconductor pellets.

The semiconductor art has been burdened with many problems relating to the removal of a single pellet from a previously subdivided semiconductor wafer for the following reasons. First, when the subdivided wafer is secured to a shim (i.e., a thin rectangular-shaped flexible metallic plate) by a suitable wax layer, the wax must be dissolved before the pellets are released. In other words, when one is released, all are released. Second, the scribe lines that outline the electrically useful portions of the parent wafer into pellets are straight lines, however, upon fracturing, the fracture planes, oftentimes, break at an angle thereby "locking-in" the individual pellet to its neighbors.

The first problem can be eliminated by using a shimless-scribing technique as described in co-pending application Ser. No. 800,535 which is also assigned to the present assignee. In this process the wafer is scribed into useful electrical portions followed by attachment of a thin, flexible plastic sheet over at least the scribed surface of the wafer. A bending means is then brought into an engaging relationship with the unscribed surface of the wafer thereby fracturing the wafer into individual pellets whereby the pellets are still secured to the plastic sheet in the same relative orientation occupied in the parent wafer. However, even though the pellets are fractured into discrete pellets they are still "locked-in" to each other.

Accordingly, one object of this invention is to provide a subdivided semiconductor wafer separator that provides either a manual or automatic means for separating a previously subdivided parent wafer into individual pellets spaced from one another without deleteriously affecting their adjacent pellets.

Another object of this invention is to provide a subdivided semiconductor wafer separator that separates each pellet in a previously subdivided wafer far enough apart from its neighboring pellets to enable it to be easily removed from the parent wafer when using conventional semiconductor manufacturing techniques.

Still another object of this invention is to provide a subdivided semiconductor wafer separator whereby each individual pellet of a previously subdivided wafer retains a relatively close orientation to its original position in the parent wafer prior to its being subdivided.

These and other objects of this invention will be apparent from the following description and the accompanying drawing, wherein.

Briefly, this invention relates to a subdivided semiconductor wafer separator. One preferred exemplary example of a separator consists of an upper and lower member each having an aperture running through its center. Fastened between these two members is a diaphragm made of a stretchable, semi-adhesive material having at least one serrated surface facing the top member. A previously subdivided wafer is placed, unscribed-surface-down, onto the serrated surface of the diaphragm. A drive member is provided in the aperture of the lower member contiguous with the diaphragm. Upon the upward movement of the drive member the diaphragm stretches thereby enabling the subdivided wafer to space its pellets apart from each other along the previously fractured lines due to the stretching action of the diaphragm. In this way, each pellet is like an island with the diaphragm acting as the surrounding sea. When the pellets are in this position any individual pellet in the parent subdivided wafer can be easily removed or operated upon at a subsequent work station without deleteriously affecting any other neighboring pellet. The upward movement is then released and the pellets, if any remain, return to their original position in the parent subdivided wafer.

Figure 1:
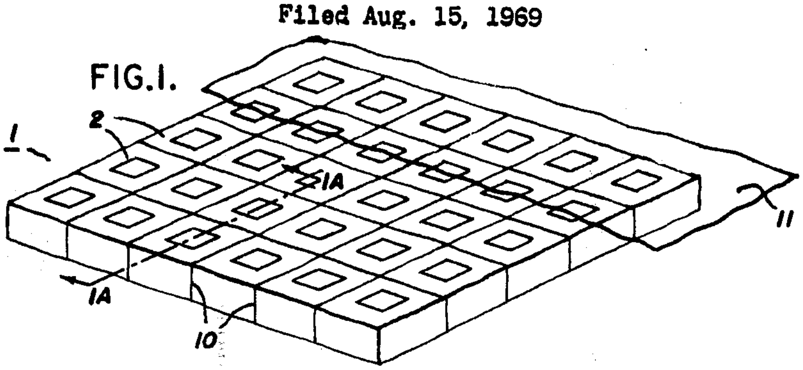
FIG. 1 is a fragmentary isometric view of a subdivided semiconductor wafer to which this invention is particularly applicable.
Figure 1A:
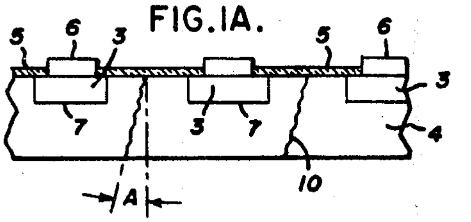
FIG. 1A is an enlarged cross-sectional view of a portion of the subdivided wafer shown in FIG. 1.

In FIGS. 1 and 1A there is shown a portion of a semiconductor wafer 1. Formed in the wafer by diffusion and masking techniques well known to those skilled in the art are individual semiconductor devices 2. These devices 2 may be, for example, diodes, transistors, thyristors, integrated circuit devices or any combination thereof. As shown, the devices 2 in FIGS. 1 and 1A are PN junction diodes each comprising a P-type anode region 3 which is formed in a N-type cathode substrate 4, thus producing a PN junction 7. The substrate 4 may be made of any conventional semiconductor material but is preferably silicon.

The planar junctions 7 of the PN diodes 2 are protected by an insulating layer 5 which may be, for example, silicon dioxide, silicon nitride or a combination of both. Contact pads or areas 6 of any suitable metallic contact material are provided on the surface of region 3 as shown in FIG. 1A. For ease of illustration and understanding, the insulating layer 5 and the contact pads 6 are not shown in other than FIG. 1A.

One suitable method of subdividing the semiconductor wafer 1 called "shimless scribing" entails first scribing lines on the wafer 1 thereby outlining the pellets 2. The wafer 1 is then placed on a pad of resilient material. At least one surface is then covered with a thin coherent sheet of flexible material 11 capable of direct adhesion to the wafer that acts as a temporary pellet carrier. Next, a bending load is applied along the scribe lines by moving a suitable bending member relative to the covered surface of the wafer 1 thereby fracturing the wafer along fracture lines 10 into individual pellets 2 such that they are individually adhered to the flexible sheet in essentially the same relative position and orientation they occupied in the parent wafer prior to the subdivision.

It is, of course, appreciated that other methods of subdivision such as sawing, sand blasting, etc., may also be used in performing this invention. All of the techniques used to form and subdivide the above portions of the semiconductor wafer 1 are well known to those skilled in the art and are not part of this invention.

Once the wafer 1 is subdivided the fracture lines 10 do not always fracture perpendicular to the top surface of the pellet 2. Instead, depending on the orientation of the semiconductor material used the fracture lines break at an angle A along fracture planes as shown in FIG. 1A and thereby act to mechanically "lock-in" each pellet to its neighbor. When the (111) plane is used angle A is about 19.5 degrees. For the (110 and (100) planes the fracture lines are perpendicular to the top surface of the pellet. Besides the effect of the mechanical "lock-in" there is a certain amount of friction between the side walls of the pellets which also increases the difficulty of removing just a single pellet from the subdivided wafer.

Figure 2:
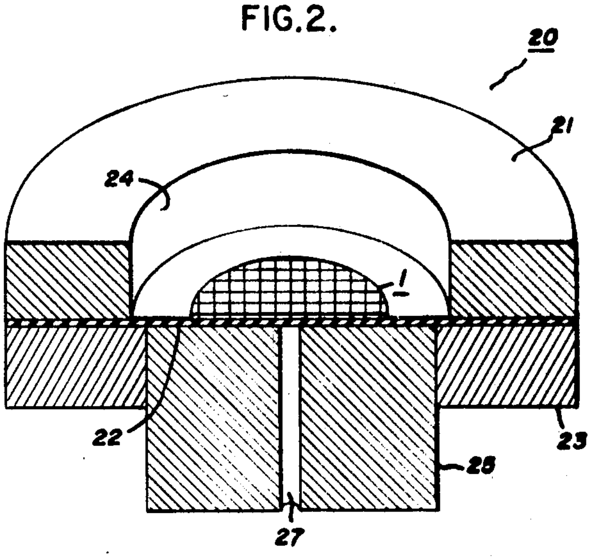
FIG. 2 is an isometric view of the subdivided semiconductor wafer shown in FIG. 1 and the pellet separator at an intermediate stage in the process of the present invention.
Figures 2A, 3:
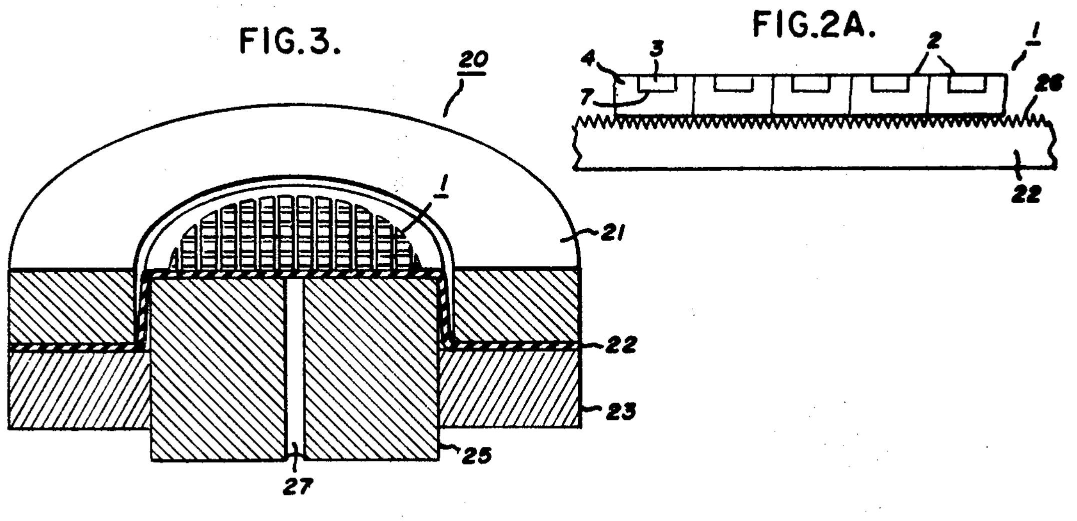
FIG. 2A is an enlarged fragmentary cross-sectional view of a portion of FIG. 2.
FIG. 3 is an isometric view of the subdivided semiconductor wafer of FIG. 1 and the pellet separator following completion of the process of the present invention.

FIGS. 2 and 3 show one preferred embodiment of an apparatus 20 particularly suitable for eliminating the ill effects of the mechanical "lock-in" and friction by spacing each pellet from its adjoining neighbors. The pellet separator apparatus 20 comprises a top and bottom member 21 and 23 respectively which can be made of a suitable metal or plastic. Typically, 21 and 23 are made of aluminum due to its ease of machinability and durability. Formed in the center of the top and bottom members 21 and 23 is an aperture 24. Fastened in a taut position between the two members 21 and 23 by suitable means well known to those skilled in the art such as bolts, clamps, etc. is a diaphragm 22 made of a stretchable material such as silicone rubber.

Figure 3A:
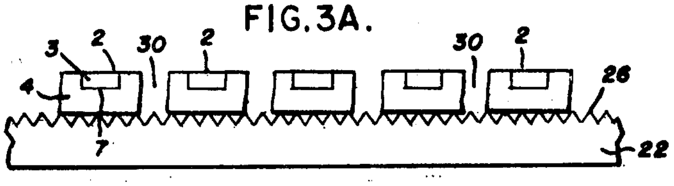
FIG. 3A is an enlarged fragmentary cross-sectional view of a portion of FIG. 3.

One material preferred because of its having a modulus of elasticity substantially higher than that of the semiconductor material as well as its adhesive ability with silicon is Room Temperature Vulcanized (RTV) 630 silicone rubber, commercially available from the General Electric Company in Waterford, N.Y. The RTV 630 comprises 100 grams RTV 630A, 10 grams RTV 630B and 7 grams diluent (RTV oil additive). The RTV 630 is then post cured at 100° C. for 1 hour. The diaphragm 22 must also be capable of frequently expanding and contracting without losing its shape. It is further preferred that at least one surface of the diaphragm be serrated as shown in FIGS. 2A and 3A at 26. The shape of the serrated surface can take a variety of forms as long as it at least partially adheres to a portion of the pellet's bottom surface and helps separate the pellets from each other.

A drive member 25 made of any suitable metal or plastic is positioned directly below the unserrated surface of the diaphragm 22 such that it can freely move within the lower portion of the aperture 24. A hole 27 is provided in the center of the drive member 25 to allow the escape of any air that might accumulate under the diaphragm 22 during the upward movement of the drive member 25.

The subdivided wafer 1 to be separated is placed onto the serrated surface 26 of the diaphragm 22. Preferably, the scribed surface of the wafer 1 faces towards the top member 21 for ease of operating on the devices 2. This is best shown in FIG. 2A. A driving mechanism is then used in association with the drive member thereby causing the drive member 25 to engage the bottom surface of the diaphrgam 22 thereby forcing it up into the upper portion of the aperture 24 as shown in FIG. 3. In this way, the diaphragm 22 is stretched in two mutually perpendicular coordinates in the plane of the top face of the wafer 1. A suitable locking means not shown in FIGS. 2 or 3 can be used to hold the diaphragm in place once the desired distance between the pellets 2 is reached. This latter position of the pellets is best illustrated in FIG. 3A with 30 denoting the spacings between the pellets 2. The pellets are now in a position to be removed one at a time or otherwise operated upon at subsequent work stations such as device assembly, lead attachment, etc., without physically disturbing its neighboring pellets.

It is, of course, appreciated that other means can be used to hold the stretchable material in a taut condition as long as the pellets maintain the same position and orientation they occupied in the parent wafer. Further, the driving means used to stretch the diaphragm can be applied in a variety of ways as long as the stretching action acts to space the pellets from each other in two mutually perpendicular coordinates in the plane of the major face.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. A semiconductor pellet separator comprising a top and a bottom member having an aperture located through each of their centers; a diaphragm fastened between said top and bottom members comprising a taut sheet of stretchable material having at least one semiconductor-pellet supporting serrated surface which faces the top member; and a means in said aperture which can move freely up and down within said aperture thereby causing the diaphragm to elongate through the upward stroke of said means and upon the release of the upward stroke returns the diaphragm to its normal shape.

2. A semiconductor pellet separator as recited in claim 1, wherein said stretchable material is silicone rubber.

References Cited

UNITED STATES PATENTS 3,447,227 6/1969 Wollam ............ 214—1X
3,448,510 6/1969 Bippus et al.

GERALD M. FORLENZA, Primary Examiner

F. E. WERNER, Assistant Examiner

U.S. Cl. X.R.

29—413